United States Patent [19]

Jiang

[11] Patent Number: 5,587,665
[45] Date of Patent: Dec. 24, 1996

[54] TESTING HOT CARRIER INDUCED DEGRADATION TO FALL AND RISE TIME OF CMOS INVERTER CIRCUITS

[75] Inventor: Chun Jiang, San Jose, Calif.

[73] Assignee: VLSI Technology, Inc., San Jose, Calif.

[21] Appl. No.: 503,760

[22] Filed: Jul. 18, 1995

[51] Int. Cl.$^6$ ................. H03K 19/00; H03K 19/0948
[52] U.S. Cl. ................. 326/16; 326/83; 327/288
[58] Field of Search ................. 326/83, 121, 9, 326/16; 327/284–285, 288

[56] References Cited

U.S. PATENT DOCUMENTS

| | | | |
|---|---|---|---|
| 4,700,089 | 10/1987 | Fujii et al. | 327/288 |
| 4,920,287 | 4/1990 | Hartgring et al. | 326/21 |
| 5,245,585 | 9/1993 | Voss et al. | 365/238.5 |

OTHER PUBLICATIONS

Khandker N. Quander, Ping K. Co, and Chenming Hu, *Projecting CMOS Circuit Hot–Carrier Reliability from DC Device Lifetime*, IEDM 93, 1993, p. 511.

Chun Jiang and Eric Johnson, *AC Hot–Carrier Degradation in a Voltage Controlled Oscillator*, IRPS 1993, p. 53.

Primary Examiner—Edward P. Westin
Assistant Examiner—Jon Santamauro
Attorney, Agent, or Firm—Douglas L. Weller

[57] ABSTRACT

Performance degradation resulting from hot carrier stress is determined using a special test circuit. The test circuit is formed using a string of inverters on an integrated circuit. The string of inverters is connected in series. Every other inverter in the string of inverters uses cascaded transistors so that performance of the inverters with cascaded are not degraded by introduced hot carrier stress. For example, odd numbered inverters are each constructed using cascaded PMOSFETs and cascaded NMOSFETs and even numbered inverters are each constructed using a single PMOSFET and a single NMOSFET. On an input of the string of inverters, a first signal is placed which transitions from logic 0 to logic 1. Propagation delay of the first signal through the string of inverters is measured. Also, a second signal which transitions from logic 1 to logic 0 is placed on the input of the string of inverters. Propagation delay of the second signal through the string of inverters is measured. Then, sufficient hot carrier stress is added to the string of inverters so that inverters not constructed using cascaded transistors will have degraded performance. After introduction of the hot carrier stress, a third signal which transitions from logic 0 to logic 1 is placed on the input of the string of inverters. Propagation delay of the third signal through the string of inverters is measured. Finally, a fourth signal which transitions from logic 1 to logic 0 is placed on the input of the string of inverters. Propagation delay of the fourth signal through the string of inverters is measured.

10 Claims, 3 Drawing Sheets

TESTING HOT CARRIER INDUCED DEGRADATION TO FALL AND RISE TIME OF CMOS INVERTER CIRCUITS

BACKGROUND

The present invention concerns the field of testing integrated circuits and pertains particularly to testing hot carrier induced degradation to fall and rise time of CMOS inverter circuits.

Testing is an integral part in the designing and manufacturing devices such as integrated circuits. In addition to testing of integrated circuits under normal operating conditions, it is also desirable to test integrated circuits after they have undergone stress conditions. For example, performance of integrated circuits can be degraded by hot carrier stress. See for example, Khandker N. Quander, Ping K. Co, and Chenming Hu, *Projecting CMOS Circuit Hot-Carrier Reliability from DC Device Lifetime*, IEDM 93, 1993, pp. 511; and Chun Jiang and Eric Johnson, *AC Hot-Carrier Degradation in a Voltage Controlled Oscillator*, IRPS 1993, p. 53. It is desirable to be able to accurately measure the effect on performance of integrated circuits resulting from hot carrier stress.

SUMMARY OF THE INVENTION

In accordance with the preferred embodiment of the present invention performance degradation resulting from hot carrier stress is determined using a special test circuit. The test circuit is formed using a string of inverters on an integrated circuit. The string of inverters is connected in series. Every other inverter in the string of inverters uses cascaded transistors so that performance of the inverters with cascaded are not degraded by introduced hot carrier stress.

For example, odd numbered inverters are each constructed using cascaded PMOSFETs and cascaded NMOSFETs and even numbered inverters are each constructed using a single PMOSFET and a single NMOSFET. Alternately, even numbered inverters are each constructed using cascaded PMOSFETs and cascaded NMOSFETs and odd numbered inverters are each constructed using a single PMOSFET and a single NMOSFET.

On an input of the string of inverters, a first signal is placed which transitions from logic 0 to logic 1. Propagation delay of the first signal through the string of inverters is measured. Also, a second signal which transitions from logic 1 to logic 0 is placed on the input of the string of inverters. Propagation delay of the second signal through the string of inverters is measured.

Then, sufficient hot carrier stress is added to the string of inverters so that inverters not constructed using cascaded transistors will have degraded performance. After introduction of the hot carrier stress, a third signal which transitions from logic 0 to logic 1 is placed on the input of the string of inverters. Propagation delay of the third signal through the string of inverters is measured. Finally, a fourth signal which transitions from logic 1 to logic 0 is placed on the input of the string of inverters. Propagation delay of the fourth signal through the string of inverters is measured.

The resulting data may be used to independently determine how hot carrier stress degrades rise time performance of an inverter and how hot carrier stress degrades fall time performance of an inverter. For example, when odd numbered inverters are each constructed using cascaded PMOSFETs and cascaded NMOSFETs and even numbered inverters are each constructed using a single PMOSFET and a single NMOSFET, the rise time component of performance degradation resulting from the hot carrier stress is determined by subtracting propagation delay of the first signal through the string of inverters from propagation delay of the third signal through the string of inverters. Likewise, the fall time component of performance degradation resulting from the hot carrier stress is determined by subtracting propagation delay of the second signal through the string of inverters from propagation delay of the fourth signal through the string of inverters.

Similarly when even numbered inverters are each constructed using cascaded PMOSFETs and cascaded NMOSFETs and odd numbered inverters are each constructed using a single PMOSFET and a single NMOSFET, the fall time component of performance degradation resulting from the hot carrier stress is determined by subtracting propagation delay of the first signal through the string of inverters from propagation delay of the third signal through the string of inverters. Likewise, the rise time component of performance degradation resulting from the hot carrier stress is determined by subtracting propagation delay of the second signal through the string of inverters from propagation delay of the fourth signal through the string of inverters.

The present invention allows for an accurate and separate measurement of the individual contribution of the rise time delay component and the individual contribution of the fall time delay component to degradation resulting from host carrier stress.

DESCRIPTION OF THE PREFERRED EMBODIMENT

For circuitry within integrated circuits, particularly those which are used for device input/output I/O, it is important that propagation delay through the circuits is minimized and that signals generated by the circuitry have optimal rise and fall output ramps. It is important, therefore, to ascertain the amount of degradation resulting from hot carrier induced stress in circuitry within integrated circuits, particularly for circuitry used in device I/O.

Hot carrier stress induced degradation in CMOS inverter circuits includes two components. The first component is a rise time delay component. The second component is a fall time delay component. It is important to determine the extent of hot carrier stress induced degradation for both components.

Figure 1:
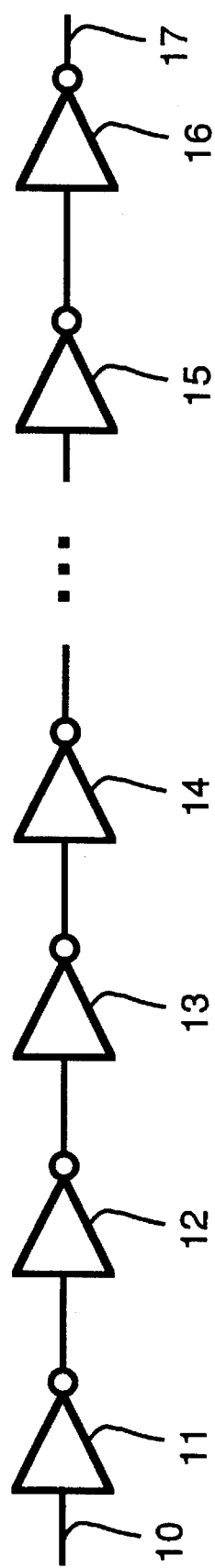
FIG. 1 shows a string of inverters used to perform hot carrier stress testing in accordance with a preferred embodiment of the present invention.

The effect of hot carrier stress on circuit performance may be measured using a string of inverters formed on an integrated circuit. The inverters are connected in series. For example, FIG. 1 shows a string of inverters. The string of inverters shown in FIG. 1 includes an inverter 11, an inverter 12, an inverter 13, an inverter 14, an inverter 15 and an inverter 16. The number of inverters may vary significantly. The number of inverters could be as low as two and as many inverters as there is room for on an integrated circuit. In the preferred embodiment, seventy inverters were used.

In order to test the delay degradation resulting from hot carrier stress, the signal delay from an input 10 of the string of inverters to an output 17 of the string of inverters is measured. This is first done under normal operating conditions, before the application of hot carrier stress. After the measurement of signal delay from input 10 of the string of inverters to output 17 of the string of inverters, the integrated circuit containing the string of inverters is subjected to hot carrier stress. After, the integrated circuit containing the string of inverters is subjected to hot carrier stress, the signal delay from input 10 of the string of inverters to output 17 of the string of inverters is again measured. The difference in the signal delay values is a result of the hot carrier stress induced degradation in the inverter circuits.

Figure 2:
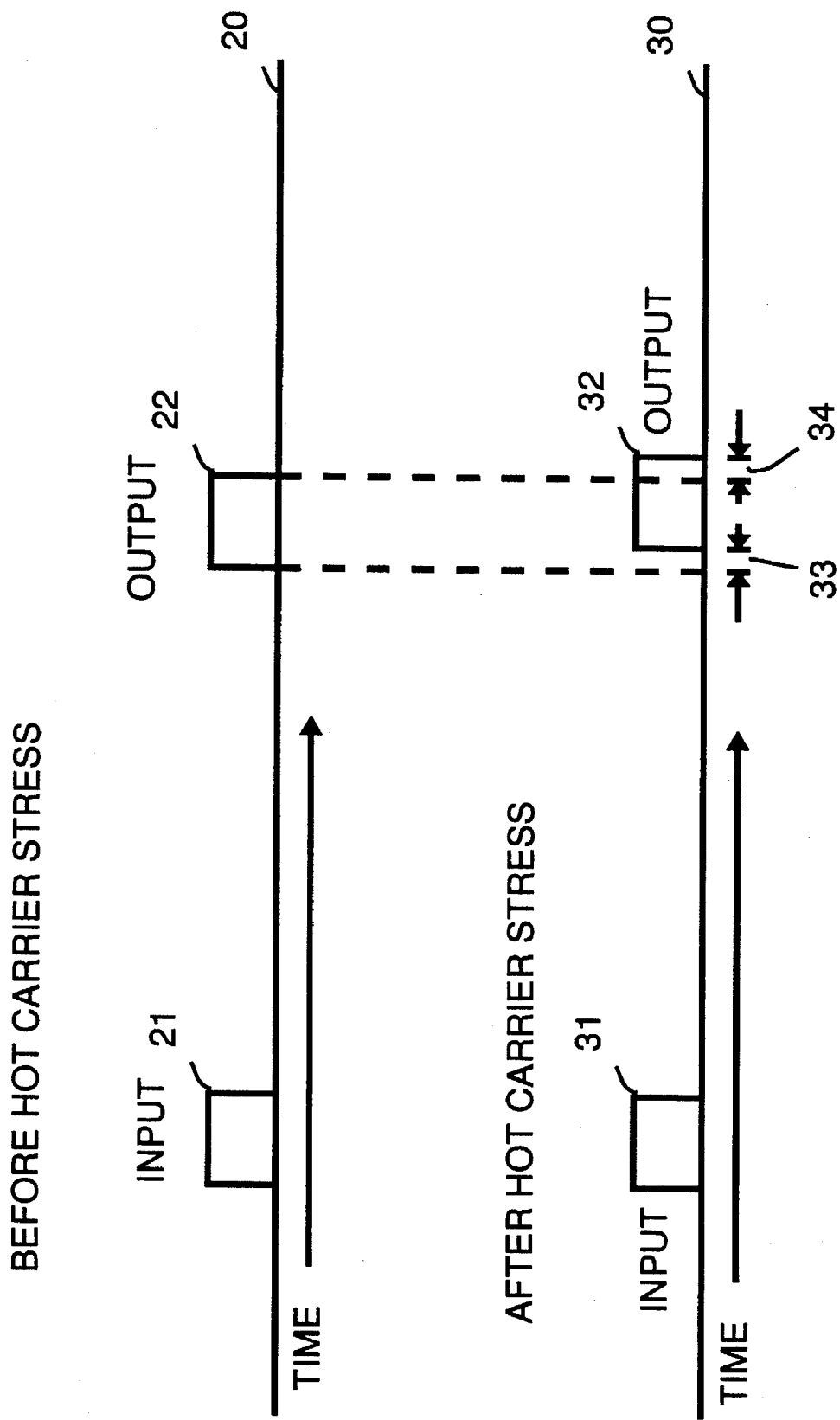
FIG. 2 shows the effects of hot carrier stress degrading rise times and fall times in accordance with a preferred embodiment of the present invention.

This test procedure is illustrated by FIG. 2. Before hot carrier stress is applied to the string of inverters shown in FIG. 1, signal delay from input 10 of the string of inverters to output 17 of the string of inverters is measured. This is represented by a time line 20. On time line 20, an input signal 21 is shown. Input signal 21 represents an input signal placed on input 10 of the string of inverters shown in FIG. 1. Also shown on time line 20 is an output signal 22. Output signal 22 represents an output signal placed on output 17 of the string of inverters shown in FIG. 1. The time lapse between input signal 21 and output signal 22 is due to the propagation delay through the string of inverters.

After the measurement of signal delay from input 10 to output 17, the string of inverters is subjected to hot carrier stress. After the string of inverters is subjected to hot carrier stress, the signal delay from input 10 of the string of inverters to output 17 of the string of inverters is again measured. This is represented by a time line 30. On time line 30, an input signal 31 is shown. Input signal 31 represents an input signal placed on input 10 of the string of inverters shown in FIG. 1. Also shown on time line 30 is an output signal 32. Output signal 32 represents an output signal placed on output 17 of the string of inverters shown in FIG. 1. The time lapse between input signal 31 and output signal 32 is due to the propagation delay through the string of inverters.

As can be seen, from FIG. 2, the propagation delay through the string of inverters is greater after the integrated circuit is subjected to hot carrier stress. The degradation is represented by a delayed difference 33 in the rising edge of output signal 32 and a delayed difference 34 in the falling edge of output signal 32.

As discussed above, hot carrier stress induced degradation in CMOS inverter circuit performance includes two components. The first is a rise time delay component. The second is a fall time delay component. It is desirable to separately determine the amount of delay each of these components contribute to degradation of circuit performance. However, if each inverter in the inverter string shown in FIG. 1 is of identical construction, it is extremely difficult to determine the individual contribution of the fall time delay component verses the individual contribution of the fall time delay component to performance degradation.

For example, if each inverter in the inverter string shown in FIG. 1 is of identical construction, part of the delayed difference 33 is caused by the fall time delay component and part of the delayed difference 33 is caused by the rise time delay component. This is because delayed difference 33 really measures the delay introduced in the leading edge of input signal 21 as it propagates through the inverter string. At the input of odd numbered inverters (e.g., inverters 11, 13 and 15), the leading edge transitions from logic 0 to logic 1, causing the output to the odd numbered inverter to transition from logic 1 to logic 0. Propagation through each of these odd numbered inverters thus results in an increase in the fall time delay component. However, at the input of even numbered inverters (e.g., inverters 12, 14 and 16), the leading edge transitions from logic 1 to logic 0, causing the output to the even numbered inverter to transition from logic 0 to logic 1. Propagation through each of these even numbered inverters results in an increase in the rise time delay component.

Likewise, delayed difference 34 really measures the delay introduced in the trailing edge of input signal 21 as it propagates through the inverter string. At the input of odd numbered inverters (e.g., inverters 11, 13 and 15), the leading edge transitions from logic 1 to logic 0, causing the output to the odd numbered inverter to transition from logic 0 to logic 1. Propagation through each of these odd numbered inverters results in an increase in the rise time delay component. However, at the input of even numbered inverters (e.g., inverters 12, 14 and 16), the trailing edge transitions from logic 0 to logic 1, causing the output to the even numbered inverter to transition from logic 1 to logic 0. Propagation through each of these even numbered inverters results in an increase in the fall time delay component.

Thus in order to be able to separately measure the individual contribution of the rise time delay component and the individual contribution of the fall time delay component to degradation resulting from host carrier stress, it is necessary to vary the construction of inverters in the inverter string. In the preferred embodiment, this is done by making the odd number inverters (e.g., inverters 11, 13 and 15) impervious to the introduced hot carrier stress. Thus all the degradation in performance resulting from hot carrier stress will result from degradation in performance of the even number inverters (e.g., 12, 14 and 16).

Figure 3:
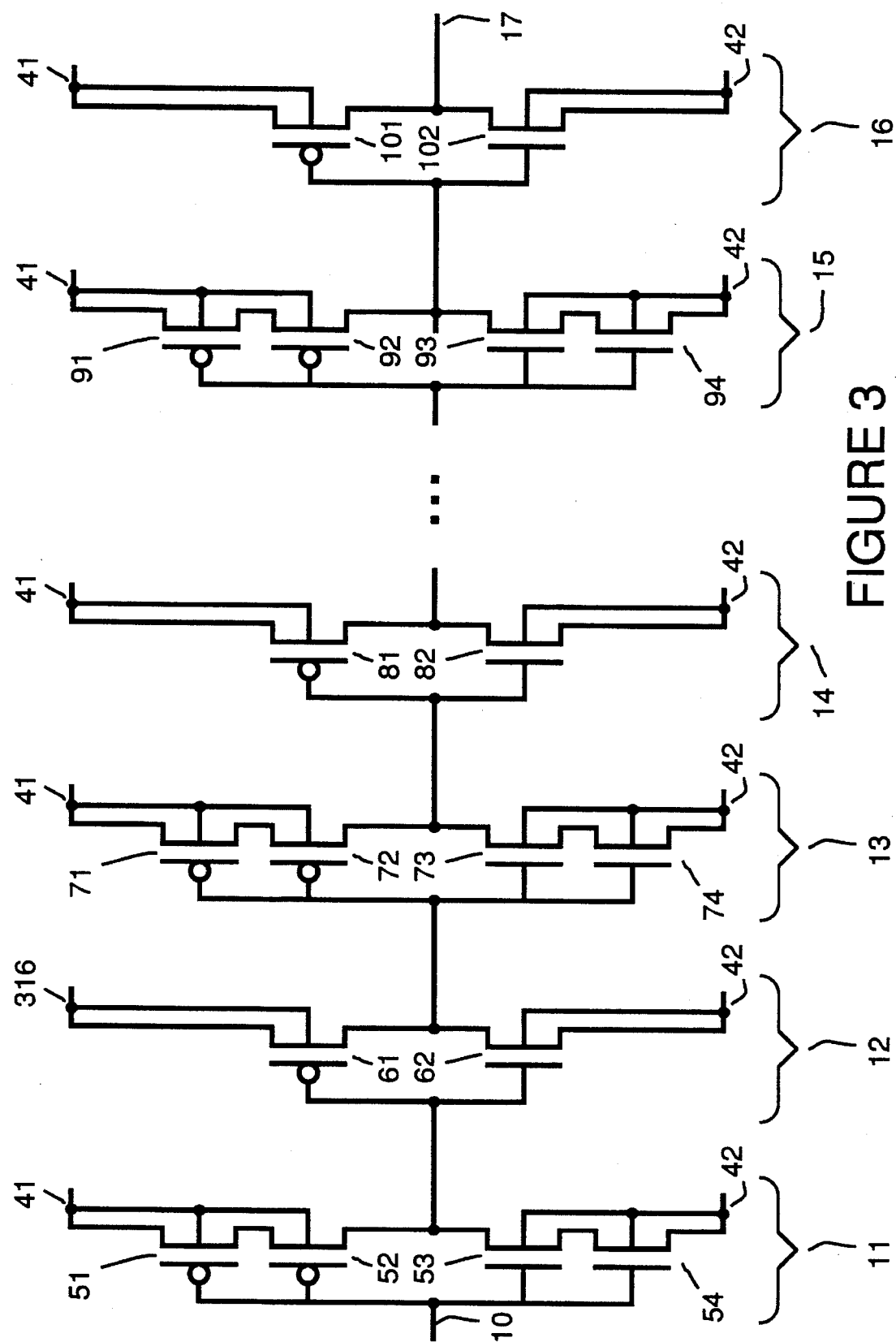
FIG. 3 shows construction of individual inverters in the string of inverters shown in FIG. 1 in accordance with a preferred embodiment of the present invention.

This is illustrated by FIG. 3. In FIG. 3, each odd numbered inverter (inverters 11, 13 and 15) is constructed using cascaded NMOSFETs and PMOSFETs. Thus inverter 11 is constructed using a PMOSFET 51, a PMOSFET 52, an NMOSFET 53 and an NMOSFET 54, connected as shown between a VDD source 41 and a VSS source 42. Inverter 13 is constructed using a PMOSFET 71, a PMOSFET 72, an NMOSFET 73 and an NMOSFET 74, connected as shown between VDD source 41 and VSS source 42. Inverter 15 is constructed using a PMOSFET 91, a PMOSFET 92, an NMOSFET 93 and an NMOSFET 94, connected as shown between VDD source 41 and VSS source 42.

In FIG. 3, each even numbered inverter (inverters 12, 14 and 16) is constructed using a single NMOSFET and a single PMOSFET. Thus inverter 12 is constructed using a PMOSFET 61, and an NMOSFET 62, connected as shown between VDD source 41 and VSS source 42. Inverter 14 is constructed using a PMOSFET 81, and an NMOSFET 82, connected as shown between VDD source 41 and VSS source 42. Inverter 16 is constructed using a PMOSFET 101, and an NMOSFET 102, connected as shown between VDD source 41 and VSS source 42.

In the preferred embodiment, VSS source 42 is at zero volts during normal operation. VDD source 43 is at five volts during normal operation. In order to introduce hot carrier stress VSS source 42 is held at zero volts and VDD is held at seven volts. An input signal is placed on the input which oscillates between zero volts and seven volts at approximately 50 MHz for a duration of, for example, one to one thousand hours.

Using the string of inverters as shown in FIG. 3, it is possible to separately measure the individual contribution of the rise time delay component and the individual contribution of the fall time delay component to degradation resulting from hot carrier stress. Particularly, when the string of inverters as shown in FIG. 3 is used, the rise time delay component may be determined by measuring delayed difference 33 in the rising edge of output signal 32. Likewise, the fall time delay component may be determined by measuring delayed difference 34 in the falling edge of output signal 32.

This is because any degradation in delayed difference 33 in the rising edge of output signal 32 is a result of degradation in rising time propagation through the even numbered inverters (e.g., inverters 12, 14 and 16). The falling time propagation through the odd numbered inverters (e.g., inverters 11, 13 and 15) is not degraded by the hot carrier stress.

Likewise, any degradation in delayed difference 34 in the falling edge of output signal 32 is a result of degradation in falling time propagation through the even numbered inverters (e.g., inverters 12, 14 and 16). The rising time propagation through the odd numbered inverters (e.g., inverters 11, 13 and 15) is not degraded by the hot carrier stress.

Thus, the specially designed inverter delay chain shown in FIG. 3 allows for the separate measurement of the individual contribution of the rise time delay component and the individual contribution of the fall time delay component to degradation.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A method for determining performance degradation of an inverter resulting from hot carrier stress, the method comprising the following steps:

(a) forming a string of inverters on an integrated circuit, the string of inverters being connected in series, comprising the following substep (a.1) constructing every other inverter in the string of inverters using cascaded transistors so that performance of these every other inverters will not be degraded by hot carrier stress introduced in step (d);

(b) on an input of the string of inverters placing a first signal which transitions from logic 0 to logic 1, and measuring propagation delay of the first signal through the string of inverters;

(c) on the input of the string of inverters placing a second signal which transitions from logic 1 to logic 0, and measuring propagation delay of the second signal through the string of inverters;

(d) after steps (b) and (c), introducing sufficient hot carrier stress to the string of inverters so that inverters not constructed using cascaded transistors will have degraded performance;

(e) after step (d), on the input of the string of inverters, placing a third signal which transitions from logic 0 to logic 1, and measuring propagation delay of the third signal through the string of inverters; and, (f) after step (d), on the input of the string of inverters placing a fourth signal which transitions from logic 1 to logic 0, and measuring propagation delay of the fourth signal through the string of inverters.

2. A method as in claim 1 wherein in step (a) odd numbered inverters are each constructed using cascaded PMOSFETs and cascaded NMOSFETs and even numbered inverters are each constructed using a single PMOSFET and a single NMOSFET.

3. A method as in claim 2 additionally comprising the following steps:

(g) subtracting propagation delay of the first signal through the string of inverters measured in step (b) from propagation delay of the third signal through the string of inverters measured in step (e) in order to determine a rise time component of performance degradation resulting from the hot carrier stress introduced in step (d); and, (h) subtracting propagation delay of the second signal through the string of inverters measured in step (c) from propagation delay of the fourth signal through the string of inverters measured in step (f) in order to determine a fall time component of performance degradation resulting from the hot carrier stress introduced in step (d).

4. A method as in claim 1 wherein in step (a) even numbered inverters are each constructed using cascaded PMOSFETs and cascaded NMOSFETs and odd numbered inverters are each constructed using a single PMOSFET and a single NMOSFET.

5. A method as in claim 4 additionally comprising the following steps:

(g) subtracting propagation delay of the first signal through the string of inverters measured in step (b) from propagation delay of the third signal through the string of inverters measured in step (e) in order to determine a fall time component of performance degradation resulting from the hot carrier stress introduced in step (d); and, (h) subtracting propagation delay of the second signal through the string of inverters measured in step (c) from propagation delay of the fourth signal through the string of inverters measured in step (f) in order to determine a rise time component of performance degradation resulting from the hot carrier stress introduced in step (d).

6. A method for determining performance degradation of an inverter resulting from hot carrier stress, the method comprising the following steps:

(a) forming a string of inverters on an integrated circuit, the string of inverters being connected in series, comprising the following substep (a.1) constructing every other inverter in the string of inverters using cascaded transistors so that performance of these every other inverters will not be degraded by hot carrier stress introduced in step (d);

(b) measuring propagation delay through the string of inverters of a transition from a first logic state to a second logic state;

(c) after step (b), introducing sufficient hot carrier stress to the string of inverters so that inverters not constructed using cascaded transistors will have degraded performance;

(d) after step (c), measuring propagation delay through the string of inverters of the transition from the first logic state to the second logic state.

7. A method as in claim 6 wherein in step (a) odd numbered inverters are each constructed using cascaded PMOSFETs and cascaded NMOSFETs and even numbered inverters are each constructed using a single PMOSFET and a single NMOSFET.

8. A method as in claim 6 wherein the transition in step (b) is from logic 0 to logic 1 and wherein the method additionally comprises the following step:

(e) subtracting propagation delay of the transition through the string of inverters measured in step (b) from propagation delay of the transition through the string of inverters measured in step (d) in order to determine a rise time component of performance degradation resulting from the hot carrier stress introduced in step (c).

9. A method as in claim 6 wherein in step (a) even numbered inverters are each constructed using cascaded PMOSFETs and cascaded NMOSFETs and odd numbered inverters are each constructed using a single PMOSFET and a single NMOSFET.

10. A method as in claim 6 wherein the transition in step (b) is from logic 1 to logic 0 and wherein the method additionally comprises the following step:

(e) subtracting propagation delay of the transition through the string of inverters measured in step (b) from propagation delay of the transition through the string of inverters measured in step (d) in order to determine a fall time component of performance degradation resulting from the hot carrier stress introduced in step (c).

* * * * *